United States Patent
Kim

(10) Patent No.: US 10,936,012 B2
(45) Date of Patent: Mar. 2, 2021

(54) DISPLAY DEVICE INCLUDING A CUSHION LAYER HAVING MEMBERS WITH DIFFERENT MODULI

(71) Applicant: SAMSUNG DISPLAY CO., LTD., Yongin-si (KR)

(72) Inventor: Se Bong Kim, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/252,033

(22) Filed: Jan. 18, 2019

(65) Prior Publication Data

US 2019/0250665 A1  Aug. 15, 2019

(30) Foreign Application Priority Data

Feb. 14, 2018  (KR) .................. 10-2018-0018513

(51) Int. Cl.
*G06F 1/16* (2006.01)
*H01L 51/00* (2006.01)
*G02F 1/1333* (2006.01)

(52) U.S. Cl.
CPC ...... *G06F 1/1641* (2013.01); *G02F 1/133305* (2013.01); *G02F 1/133308* (2013.01); *G06F 1/1643* (2013.01); *G06F 1/1652* (2013.01); *H01L 51/0097* (2013.01); *G02F 2201/503* (2013.01)

(58) Field of Classification Search
CPC .... G06F 1/1641; G06F 1/1643; G06F 1/1652; G02F 2201/503; G02F 1/133305; G02F 1/133308; G02F 1/133314; H01L 51/0097
See application file for complete search history.

(56) References Cited

U.S. PATENT DOCUMENTS

| 9,539,757 | B2  | 1/2017 | Ramirez et al. |
| 2007/0076381 | A1* | 4/2007 | Han .................. F21V 29/80 361/749 |
| 2008/0042940 | A1  | 2/2008 | Hasegawa |
| 2013/0135877 | A1* | 5/2013 | Oh .................. B32B 3/266 362/362 |
| 2015/0195936 | A1* | 7/2015 | Park .................. G02F 1/1333 361/749 |

(Continued)

FOREIGN PATENT DOCUMENTS

KR  1020140020566  2/2014
KR  1020150050706  5/2015

(Continued)

OTHER PUBLICATIONS

Extended European search report for Appln Serial No. 19157069.6-1210 dated May 29, 2019.

*Primary Examiner* — Hoa C Nguyen
(74) *Attorney, Agent, or Firm* — F. Chau & Associates, LLC

(57) ABSTRACT

A display device includes a cushion layer and a display panel disposed on a top surface of the cushion layer. The cushion layer includes a first member and a second member at least partially surrounding the first member. The first member includes a first material having a first modulus. The second member includes a second material having a second modulus that is smaller than the first modulus. The first member includes a plurality of grooves disposed therein.

39 Claims, 30 Drawing Sheets

(56) References Cited

U.S. PATENT DOCUMENTS

| | | | |
|---|---|---|---|
| 2017/0064845 A1* | 3/2017 | Jung | H05K 1/028 |
| 2017/0153668 A1 | 6/2017 | Jang et al. | |
| 2017/0254518 A1* | 9/2017 | Vasylyev | G02B 6/0083 |
| 2018/0090698 A1* | 3/2018 | Jeong | H01L 27/3276 |
| 2018/0164923 A1* | 6/2018 | Hirabayashi | G06F 3/044 |
| 2019/0013493 A1* | 1/2019 | Sonoda | H01L 51/56 |

FOREIGN PATENT DOCUMENTS

| | | |
|---|---|---|
| KR | 1020160089009 | 7/2016 |
| KR | 20170077235 | 7/2017 |
| KR | 20170078727 | 7/2017 |
| WO | WO 2016/073549 | 5/2016 |
| WO | WO 2016/073551 | 5/2016 |

\* cited by examiner

DISPLAY DEVICE INCLUDING A CUSHION LAYER HAVING MEMBERS WITH DIFFERENT MODULI

CROSS-REFERENCE TO RELATED APPLICATION

This application claims priority to and the benefit of Korean Patent Application No. 10-2018-0018513 filed in the Korean Intellectual Property Office on Feb. 14, 2018, the entire contents of which are herein incorporated by reference.

TECHNICAL FIELD

The present disclosure relates to a display device and, more specifically, to a display device including a cushion layer having members with different moduli.

DISCUSSION OF THE RELATED ART

A display device is a device that displays an image. Examples of products incorporating display devices include a television, a computer monitor, a personal digital assistant (PDA), and Internet-connected devices, which may be referred to as "smart equipment" of which demand has recently increased.

Display devices may use a flat type of display module with high display quality such as an organic light emitting panel, a liquid crystal panel, a plasma display panel, an electrophoretic display panel, etc.

Recently, flexible display devices which may be light weight and thin have been developed. However, in the case of the flexible display device, because a thin substrate is used to achieve flexibility, the flexible display device is relatively susceptible to impact.

SUMMARY

A display device includes a cushion layer and a display panel disposed on a top surface of the cushion layer. The cushion layer includes a first member and a second member at least partially surrounding the first member. The first member includes a first material having a first modulus. The second member includes a second material having a second modulus that is smaller than the first modulus. The first member includes a plurality of grooves disposed therein.

A flexible display device includes a cushion layer and a display panel disposed on a top surface of the cushion layer. The cushion layer includes a first member and a second member at least partially surrounding the first member. The first member includes a first material having a first modulus. The second member includes a second material having a second modulus that is smaller than the first modulus. The cushion layer includes a bending portion. The first member includes a plurality of grooves disposed in the bending portion.

A method of manufacturing a display device includes preparing a cushion member including a plurality of grooves disposed therein. The cushion member is compressed to form a first member. A second member is formed to at least partially surrounding the first member. A modulus of the first member is larger than a modulus of the second member.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE EMBODIMENTS

Figure 1:
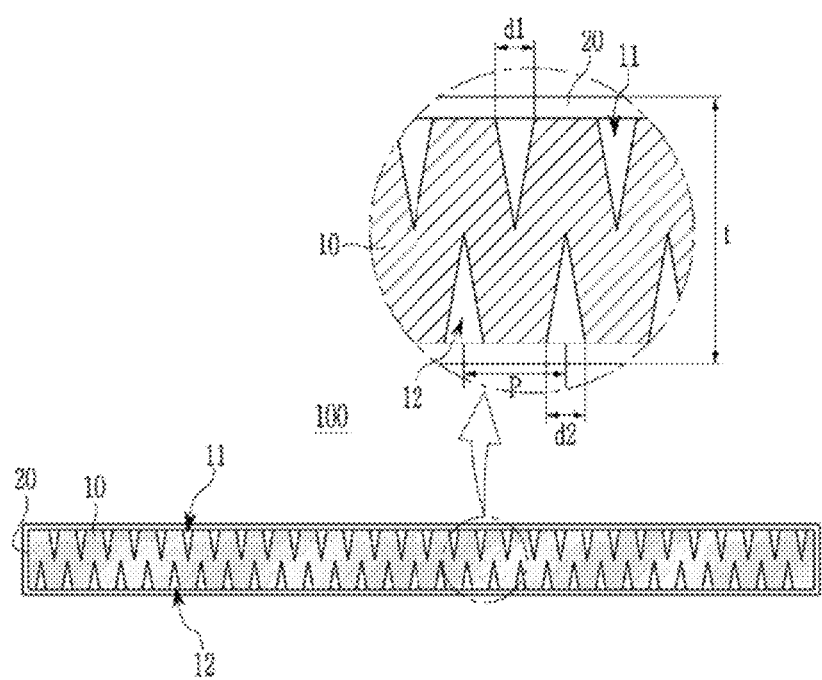
FIG. 1 is a diagram illustrating a cushion layer according to an exemplary embodiment of the present invention.

Exemplary embodiments of the present invention will be described more fully hereinafter with reference to the accompanying drawings. As those skilled in the art would realize, the described embodiments may be modified in various different ways, all without departing from the spirit or scope of the present invention.

Like reference numerals may designate like elements throughout the specification and figures.

Further, in the drawings, a size and thickness of each element may be exaggerated for better understanding and ease of description. In the drawings, the thickness of layers, films, panels, regions, etc., may be exaggerated for clarity.

It will be understood that when an element such as a layer, film, region, or substrate is referred to as being "on" another element, it can be directly on the other element or intervening elements may also be present. Further, in the specification, the word "on" or "above" means arranged on or below the object portion, and does not necessarily mean arranged on the upper side of the object portion based on a gravitational direction.

Exemplary embodiments of the present invention relate to a display device having a cushion layer included therein. An inner part and an outer part of the cushion layer may have different moduli. A plurality of grooves is formed in the cushion layer. As a result of the inclusion of the plurality of grooves, the cushion layer has excellent impact resistance and bending characteristics.

FIG. 1 shows a cushion layer 100 according to an exemplary embodiment of the present invention. Referring to FIG. 1, the cushion layer 100 includes a first member 10 disposed therein and a second member 20 at least partially enclosing an exterior of the first member. For example, the second member 20 is disposed outside the first member 10.

The first member 10 includes a plurality of first grooves 11 and a plurality of second grooves 12. Referring to FIG. 1, the plurality of first grooves 11 and the plurality of second grooves 12 of the first member 10 are arranged in the opposite directions to each other. For example, each of the plurality of first grooves 11 may originate at a top surface of the first member 10 and point downward while each of the plurality of second grooves 12 may originate at a bottom surface of the first member 10 and point upwards. Thus, opening of each of the first plurality of grooves 11 and an opening of each of the second plurality of grooves 12 are disposed at different surfaces of the first member 10.

Referring to FIG. 1, each of the first plurality of grooves 11 (the "first grooves") and each of the second plurality of grooves 12 (the "second grooves") may have a triangle shape. The plurality of first grooves 11 and the plurality of second grooves 12 may act to reduce a compressive stress or a tensile stress applied to the cushion layer 100 when bending the cushion layer 100 and may prevent a crack, etc. from forming in the cushion layer 100.

Referring to FIG. 1, the first grooves 11 and the second grooves 12 may be staggered from each other. For example, a center line of the first grooves 11 and a center line of the second grooves 12 do not meet each other. However, as an alternative, the first grooves 11 and the second grooves 12 may be arranged along the same center lines such that each of the first grooves 11 is aligned with each of the second grooves 12.

Referring to FIG. 1, a maximum width d1 of each of the first grooves 11 and/or a maximum width d2 of each of the second grooves 12 may be within the range of 10 μm to 400 μm, inclusive. When the maximum width d1 of each of the first grooves 11 and/or the maximum width d2 of each of the second grooves 12 is more than 400 μm, the cushion layer 100 might not absorb an impact applied to the display panel and may collapse. Also, when the maximum width d1 of the first grooves 11 or the maximum width d2 of the second grooves 12 is less than 10 μm, the area where the groove is compressed may be reduced such that the stress during compressive deformation might not be sufficiently absorbed.

According to an exemplary embodiment of the present invention, the first member 10 may include a material having higher modulus than that of the second member 20. The modulus of the first member 10 may be larger than that of the second member 20 by 10 times to 10,000 times. For example, the modulus of the first member 10 may be 0.1 GPa to 1000 GPa, and the modulus of the second member 20 may be 1 KPa to 1000 KPa.

The first member may include polyethylene terephthalate (PET) and/or polyimide (PI). However, the material of the first member is not limited thereto. A formation cycle P of the first grooves 11 or the second grooves 12 may be within the range of 20 μm to 1000 μm, inclusive. However, this is only an example, and the formation cycle is not limited thereto. Also, a thickness "t" of the cushion layer 100 may be within the range of 100 μm to 400 μm, inclusive. However, this is only an example, and the formation cycle is not limited thereto.

When the first member 10 disposed inside the cushion layer 100 and including the grooves is formed of the material having a high modulus and the second member 20 is formed of the material having the modulus that is lower than that of the first member 10 (the "low modulus"), the impact resistance and the bending characteristic of the cushion layer 100 may both be increased. The impact resistance and the bending characteristic might not be compatible physical properties for a single material, however as shown herein, the impact resistance and the bending characteristic may be realized by the grooves 11 and 12 of the first member 10 having the high modulus and the second member 20 having the low modulus.

An effect of the cushion layer 100 on the display device 1000 according to an exemplary embodiment of the present invention is described.

Figure 2:
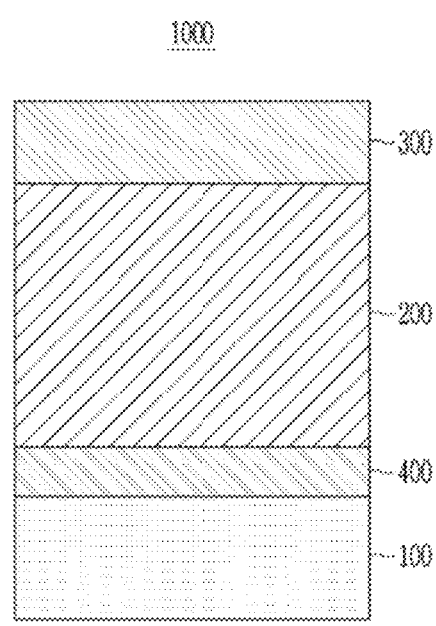
FIG. 2 is a diagram illustrating a display device according to an exemplary embodiment of the present invention.

FIG. 2 is a diagram illustrating the display device 1000 according to an exemplary embodiment of the present invention. Referring to FIG. 2, the display device 1000, according to an exemplary embodiment of the present invention, includes a cover window 300, a display panel 200, a base film 400, and the cushion layer 100. An adhesive layer may be disposed between the cover window 300 and the display panel 200, between the display panel 200 and the base film 400, and between the base film 400 and the cushion layer 100.

The display device 1000, according to an exemplary embodiment of the present invention, may be a flexible display device that is bendable. The flexible display device may either be a curved display device of which the display device is entirely curved with a predetermined curvature or a folded display device of which the display device is folded, such as folded in half. When the display device 1000 is the flexible display device, the cover window 300 may be made of a film. The cover window 300 protects the display panel 200.

The display panel 200 may include a transistor and an electrode connected thereto. The display panel 200 may be a liquid crystal panel or a display panel including an organic light emitting element. However, other kinds of display panels 200 may alternatively be used. The display panel 200 may include a light-emitting element having a quantum dot or an inorganic material as an emission layer.

A touch panel or a polarizer may be disposed between the cover window 300 and the display panel 200.

The base film 400 may support the display panel 200 and may protect the display panel 200 from damage caused by an external impact. Also, the base film 400 may smooth the impact, dissipate heat of the display panel 200, and block light of the display panel 200. However, the base film 400 may be omitted according to an exemplary embodiment of the present disclosure.

The cushion layer 100 smooths the impact applied to the display device 1000. The cushion layer 100 absorbs the impact applied at the upper part and the lower part of the display device 1000 so that the impact is not transmitted inside the display panel 200. Accordingly, damage to the display panel 200 may be prevented.

To prevent the damage to the display panel 200 and absorb the impact, the cushion layer 100 may have the high modulus. As the cushion layer 100 has the high modulus, the damage to the display panel 200 from the impact applied to the display device 1000 may be prevented.

The display device 1000, according to an exemplary embodiment of the present invention, is the flexible display device, and each layer of the flexible display device 1000 is bent. However, when the cushion layer 100 includes the material having the high modulus, the display device 1000 does not bend well, and cracks may be generated in the cushion layer 100 or other layers. Also, when the cushion layer 100 is formed of the material having the low modulus to allow the display device 1000 to bend well, impact might not be sufficiently absorbed due to the low modulus of the cushion layer 100. Accordingly, when the impact is applied to the display device 1000, the display panel 200 is damaged and a bright point or a dark point is generated.

Thus, in the flexible display device 1000, the bending characteristic of the cushion layer 100 and the impact resistance characteristic are in a trade-off relationship. When using the material having the low modulus to allow for bending, the impact resistance characteristic is reduced such that the display panel 200 is susceptible to damage, and when using the material having the high modulus to increase the impact resistance characteristic, the bending characteristic is poor such that cracks are generated in the cushion layer 100.

However, the cushion layer 100, according to exemplary embodiments of the present inventio, includes the first member 10 and the second member 20 having the different moduli. The modulus of the first member 10 is high compared with that of the second member 20, and the first member 100 absorbs the impact. The second member 20 includes the material having the low modulus compared with the first member 10 such that the second member 20 bends well. Accordingly, the cushion layer 100 may have both of the bending characteristic and the impact resistance characteristic. Also, the first member 10 having the high modulus includes the plurality of first grooves 11 and second grooves 12. When bending the cushion layer 100, the first grooves 11 and the second grooves 12 tend to extend or compress, and so the bending characteristic of the first member 10 is increased.

For example, the cushion layer 100, according to an exemplary embodiment of the present disclosure, may have both the bending characteristic of the first grooves 11 and the second grooves 12 formed in the first member and the low modulus of the second member 20 while having the impact resistance characteristic of the first member 10 having the high modulus.

Figure 3:
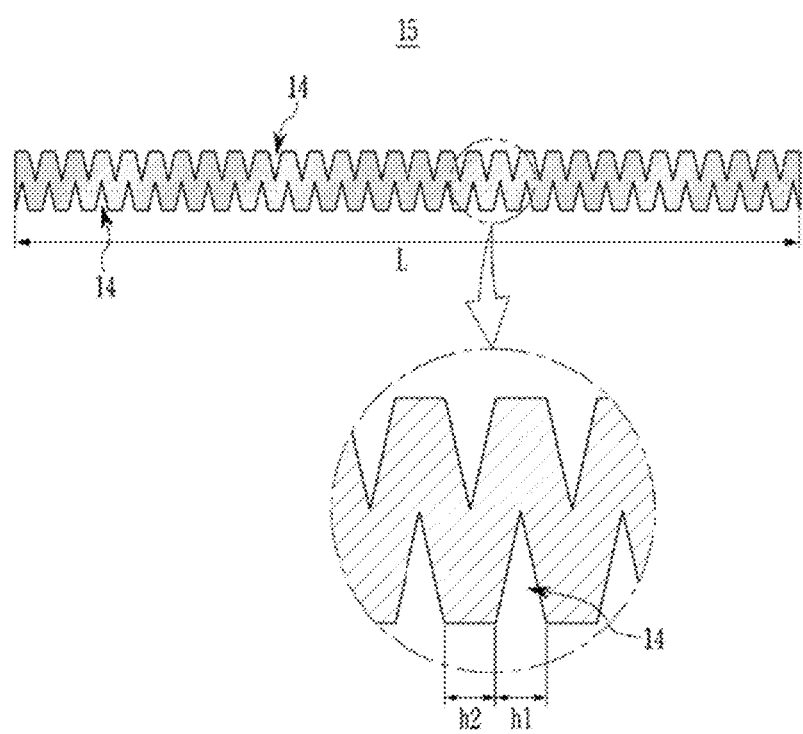
FIG. 3 is a diagram illustrating a cushion member before a first member of a cushion layer is processed.

The first member 10 may have the structure in which the cushion member 15 is compressed. FIG. 3 is a diagram illustrating the cushion member 15 before being processed in the first member 10 of the cushion layer 100. Referring to FIG. 3, the cushion member 15 has a plurality of grooves 14. In this case, the maximum width h1 of the grooves 14 is wider than the maximum width d1 of the first grooves 11 and the maximum width d2 of the second grooves 12 of the first member 10 in FIG. 1. Also, the length L of the cushion member 15 is longer than the length of the first member 10 that is finally processed. The cushion member 15 is compressed to be processed into the first member 10 and the second member 20 is formed at the exterior of the first member 10, thereby manufacturing the cushion layer 100. When the length of the cushion member 15 is L, the length of the first member 10 is ⅔L to ¾L. This reduction in length is achieved by compressing the cushion member 15 in the length-wise direction. For example, the first member 10 may be in a state in which the cushion member 15 is compressed by about 20% to 40%. Since the first member 10 is in the state in which the cushion member 15 is compressed, the tensile stress may be absorbed while the compressed part is expanded when bending the display device 1000.

In the cushion member 15 before compression, a ratio of the maximum width h1 of the grooves 14 and the minimum width h2 of the region where the groove is not formed may be 1:2 to 2:1. However, this is only an example, and other ratios may be used.

Figure 4:
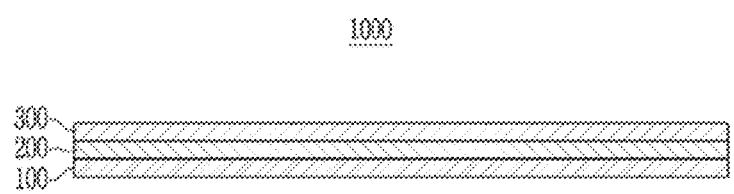
FIG. 4 is a diagram illustrating a flat state of a display device.
Figure 5:
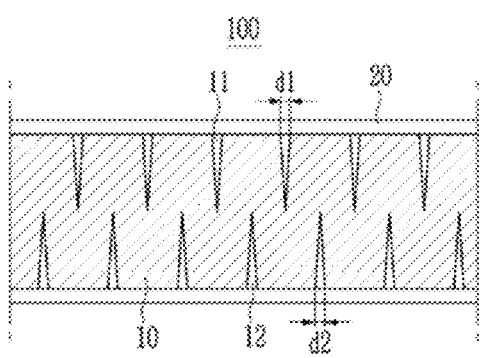
FIG. 5 is a cross-sectional diagram illustrating a cushion layer when a display device is in a flat state of FIG. 4.

FIG. 4 is a diagram illustrating the display device in the flat state, and FIG. 5 shows the cross-sectional view of the cushion layer 100 in FIG. 4. The display device 1000 of FIG. 4 is schematically shown in the state of only including the cover window 300, the display panel 200, and the cushion layer 100. Referring to FIG. 5, when the display device is flat without being bent, the maximum width d1 of the first grooves 11 of the cushion layer 100 and the maximum width d2 of the second grooves 12 are the same.

Figure 6:
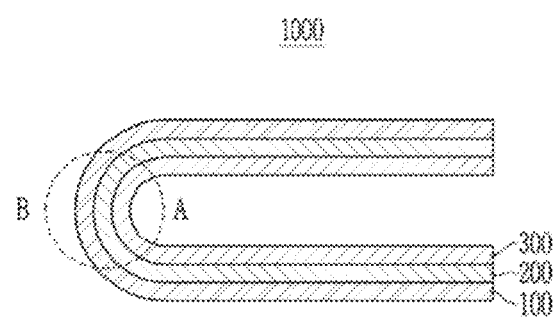
FIG. 6 is a diagram illustrating a bent state of a display device.
Figure 7:
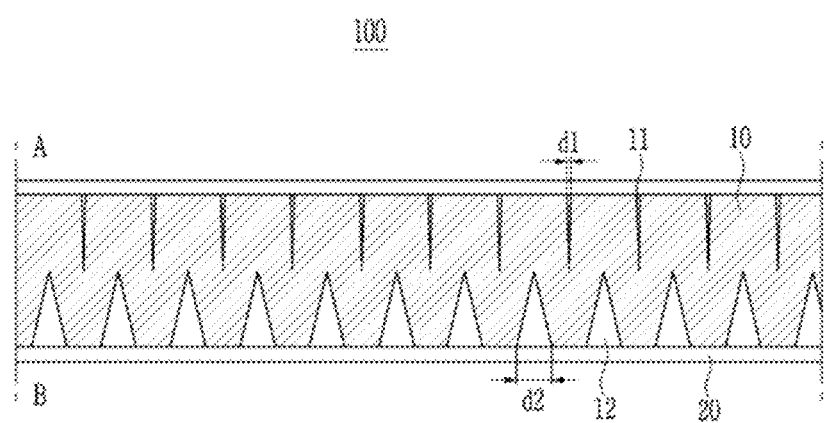
FIG. 7 is a cross-sectional diagram illustrating a cushion layer when a display device is in a bent state of FIG. 6.

FIG. 6 is a diagram illustrating a state in which the display device is bent, and FIG. 7 is a cross-sectional view of the cushion layer 100 when the display device is in the bent state of FIG. 6. FIG. 7 is the cross-sectional view of the cushion layer 100 in the bending portion (indicated by a dotted line) in FIG. 6. In FIG. 6 and FIG. 7, when the display device is bent, the compressed surface is indicated by A and the tensioned surface is indicated by B.

Referring to FIG. 7, when the display panel is bent, the first grooves 11 of a part A subjected to the compressive stress of the cushion layer 100 is compressed such that the maximum width d1 thereof decreases. In contrast, the second grooves 12 disposed at a part B subjected to the tensile stress is tensioned such that the maximum width d2 thereof increases.

Referring to FIG. 5, when the display panel is flat, the maximum width d1 of the first grooves and the maximum width d2 of the second grooves are the same, however referring to FIG. 7, when the display panel is bent, the maximum width d2 of the second grooves is larger than the maximum width d1 of the first grooves.

As described above, as the width of the groove of the part subjected to the compressive stress decreases and the width of the groove of the part subjected to the tensioned stress increases, the cushion layer 100, according to an exemplary embodiment of the present invention, may be easily bent, without cracking, despite having the high modulus.

Next, the cushion layer 100, according to an exemplary embodiment of the present invention, is described. FIG. 8 to FIG. 27 are diagrams illustrating a structure of the cushion layer 100 according to exemplary embodiments of the present invention. Differences between the cushion layer 100 of these figures and the cushion layer 100 illustrated in FIG. 1 will be mainly described below and it is to be understood that details that are omitted with respect to these figures may be at least similar to corresponding details that have already been described with respect to FIG. 1.

Figure 8:
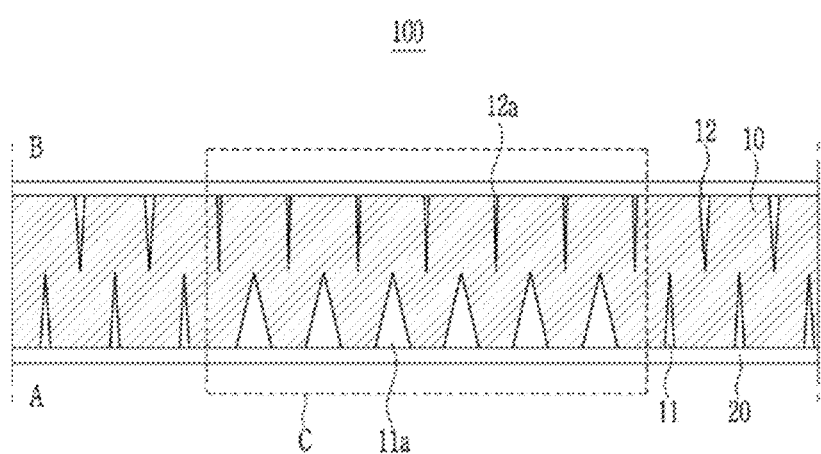
FIG. 8 to FIG. 27 are diagrams illustrating a structure of a cushion layer according to exemplary embodiments of the present invention.

FIG. 8 is a diagram illustrating the cushion layer 100 according to an exemplary embodiment of the present invention. Referring to FIG. 8, in the bending portion C, where the display device is bent, the widths of the first grooves 11 and the second grooves 12 are different. The maximum width of a bent first grooves 11a disposed at the bending portion C is wider than the maximum width of the first grooves 11 that is not at the bending portion C. In contrast, the maximum width of a bent second grooves 12a disposed at the bending portion C is narrower than the maximum width of the second grooves 12 of the region that is not the bending portion C. According to an exemplary embodiment of the present disclosure, when the display device is bent or folded, the region A subjected to the compressive stress may be compressed since the groove is wider, and the region B subjected to the tensioned stress may be tensioned since the groove is narrow. Accordingly, the cushion layer 100 may be effectively bent. The structure of FIG. 1 is suitable for the case that the bending direction of the display device is not specified, and even if the display device is bent in any direction, the compressive stress and the tensile stress may be offset. However, in the structure of FIG. 8, when the bending direction of the display device is specified, as the grooves of the compressive direction are wider and the grooves of the tensile direction are narrower, the bending characteristic of the cushion layer 100 may be further increased.

Figure 9:
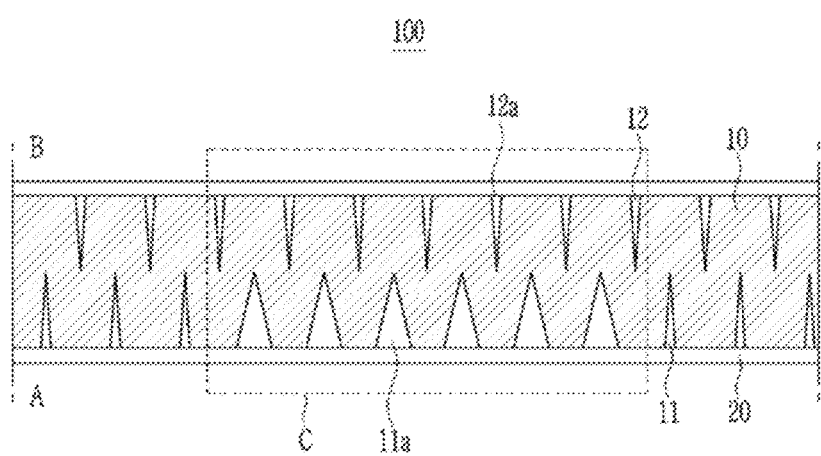
Figure 10:
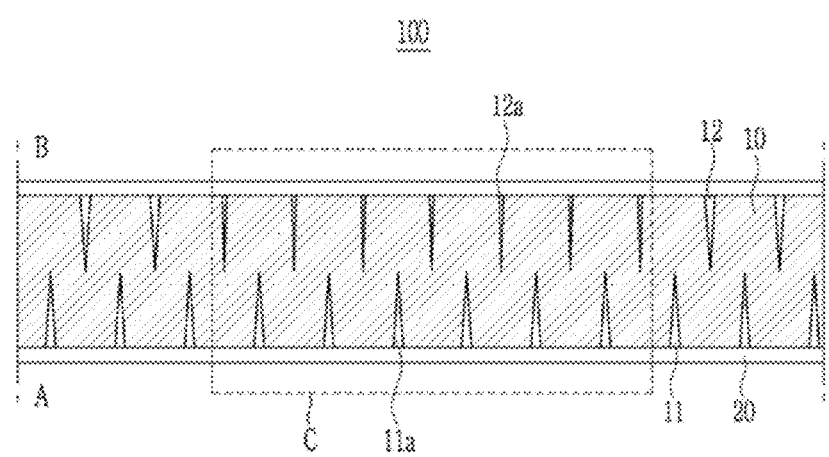

In FIG. 8, the maximum widths of the bent first grooves 11a and the first grooves 11 of the bending portion C are different and the maximum widths of the bent second groove 12a and the second grooves 12 are different, however only one of the first grooves 11 and the second grooves 12 may have the different width in the bending portion C. Referring to FIG. 9, the maximum widths of the bent first groove 11a and the first grooves 11 are different and the maximum widths of the bent second groove 12a and the second grooves 12 are the same. Also, referring to FIG. 10, the maximum widths of the bent second groove 12a and the second grooves 12 may be different and the bent first groove 11a and the first grooves 11 may be the same.

Figure 11:
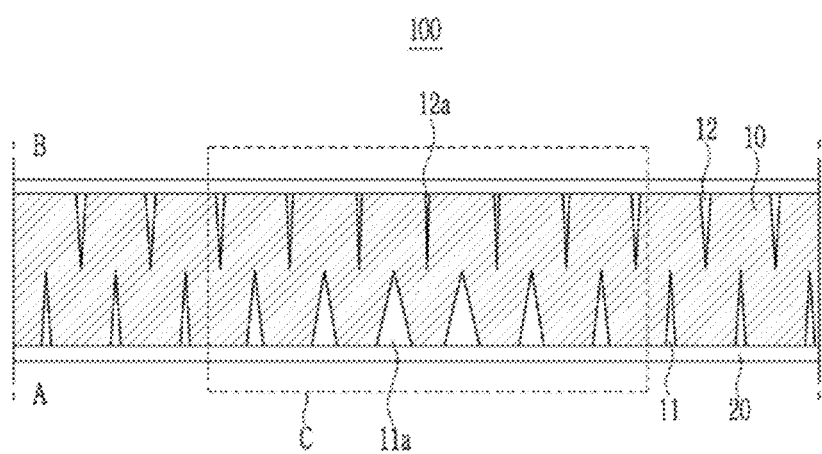

Further, a size of the groove may be controlled depending a degree of compressive stress applied. FIG. 11 is a diagram illustrating a cushion layer 100 according to an exemplary embodiment of the present invention. Referring to FIG. 11, in the bending portion C, the maximum width of the bent first groove 11a is gradually changed. For example, the maximum width of the bent first groove 11a is widened closer to the center of the bending portion C. Since the bent first groove 11a is widest at the center part of the bending portion C to which the most compressive stress is applied during the bending, the compressive stress may be effectively absorbed. This is the same in the case of the bent second groove 12a. For example, the maximum width of the bent second groove 12a decreases closer to the center from the edge of the bending portion C. Accordingly, compared with the structure of FIG. 8, the compressive stress and the tensile stress may be further effectively absorbed.

Figure 12:
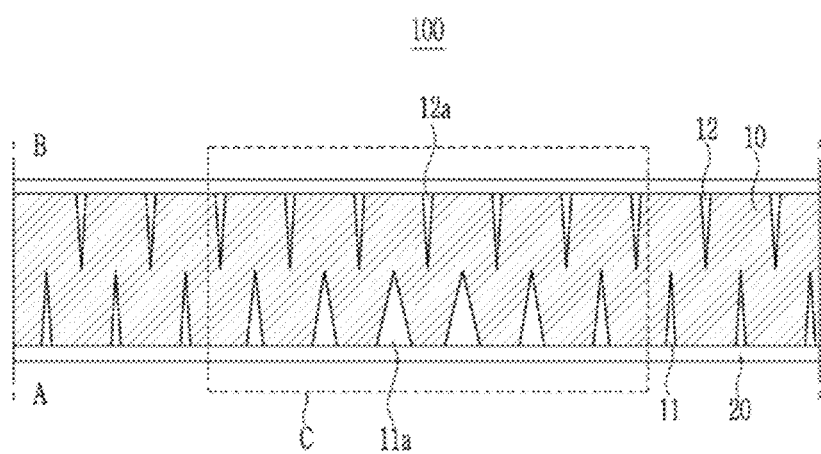
Figure 13:
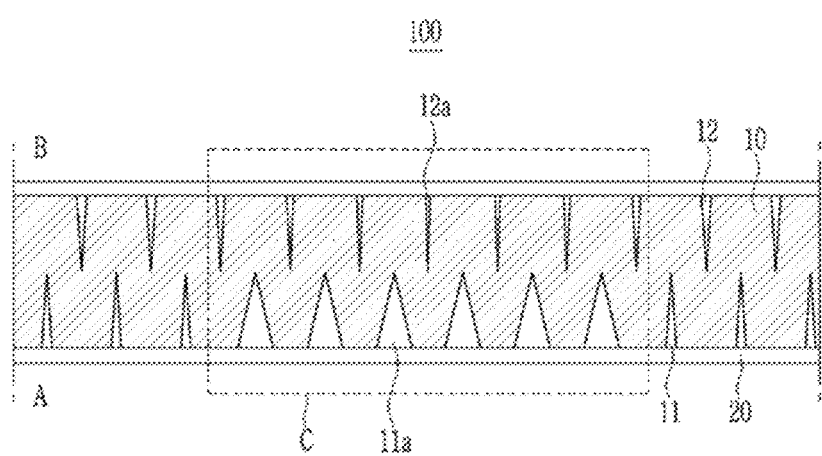

Referring to FIG. 12, only the width of the bent first groove 11a may be gradually changed in FIG. 11, and the bent second groove 12a may have the uniform width. Also, referring FIG. 13, only the width of the bent second groove 12a may be gradually changed in FIG. 11, and the bent first groove 11a may have the uniform width.

Figure 14:
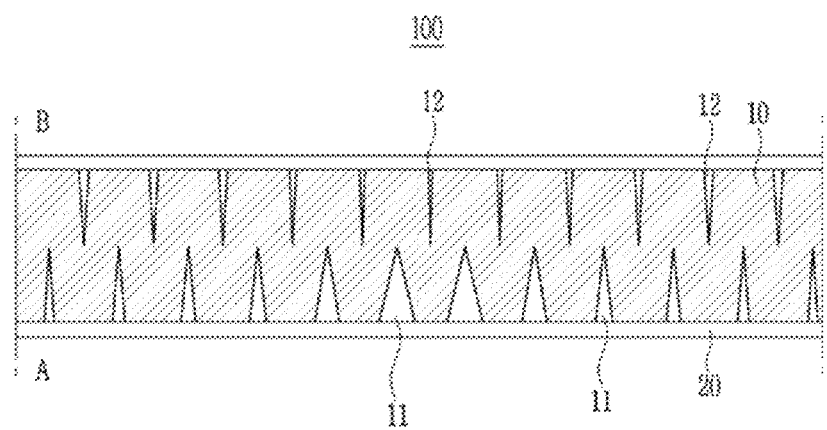

Further, in an exemplary embodiment of the present invention, the width of the first grooves 11 and the width of the second grooves 12 may be gradually changed in the entire cushion layer 100. Referring to FIG. 14, the maximum width of the first grooves 11 is gradually increased closer to the center from the edge of the cushion layer 100. Also, the maximum width of the second grooves 12 is gradually decreased to the center from the edge of the cushion layer 100. In this case, the compressive stress applied in the region A and the tensile stress applied to the region B may be uniformly distributed in stages in the entire cushion layer 100.

Figure 15:
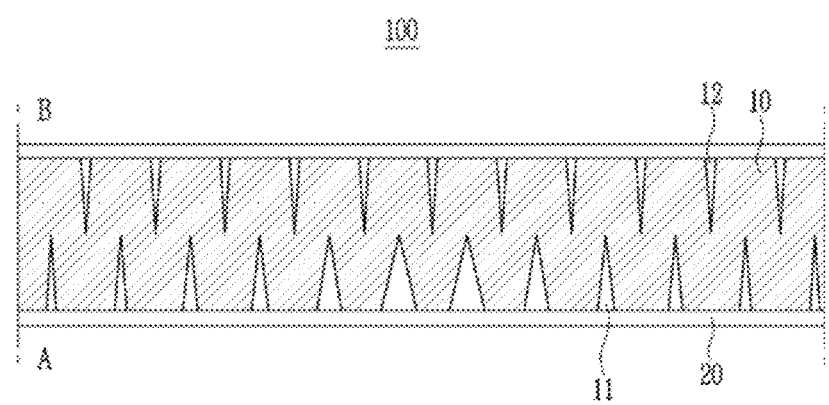
Figure 16:
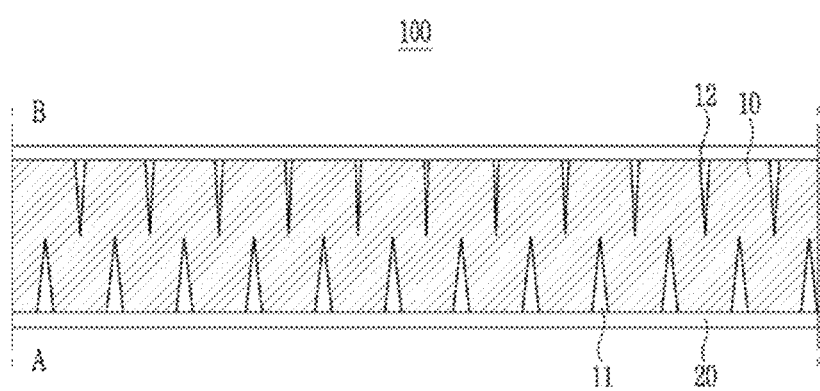

Referring to FIG. 15, the maximum width of the first grooves 11 may be gradually increased closer to the center from the edge of the cushion layer 100, and the maximum width of the second grooves 12 may be the same in the entire cushion layer 100. Referring to FIG. 16, the maximum width of the second grooves 12 is gradually decreased to the center from the edge of the cushion layer 100, and the maximum width of the first grooves 11 may be uniform in the entire cushion layer 100.

In the above, it is described based on the structure in which the first grooves 11 and the second grooves 12 are formed in the entire cushion layer 100, however the first grooves 11 and the second grooves 12 may only be formed in the bending portion C.

FIG. 17 to FIG. 22 are similar to FIG. 8 to FIG. 16, but show the cushion layer 100 in which only the first grooves 11 and the second grooves 12 are formed in the bending region.

Figure 17:
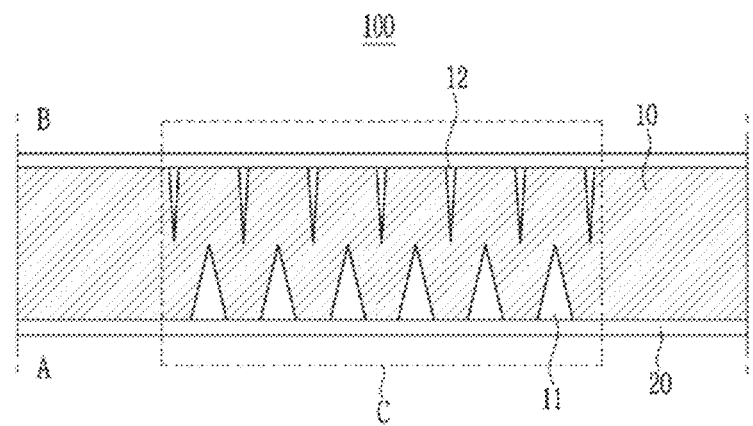
Figure 18:
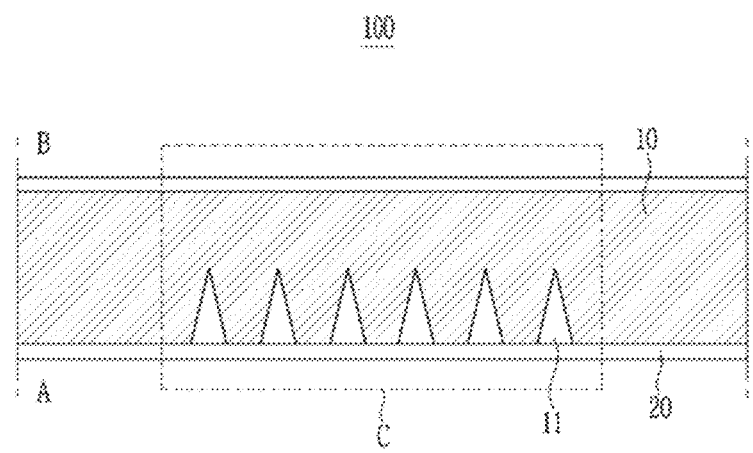
Figure 19:
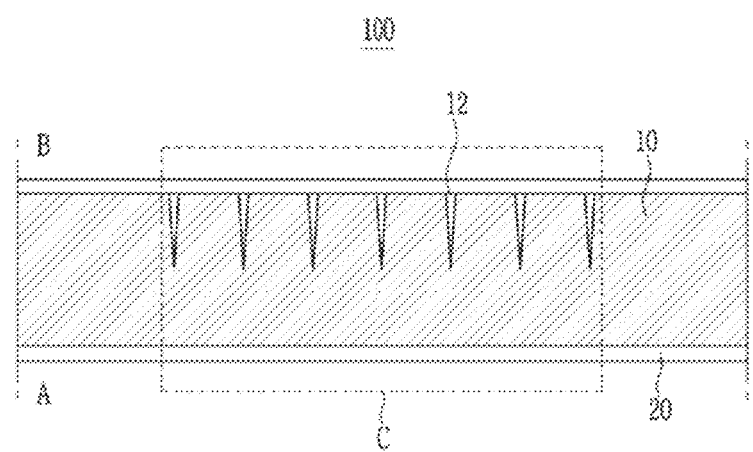

Referring to FIG. 17, the first grooves 11 and the second grooves 12 are disposed at the bending portion C, and the groove is not disposed at the region that is not the bending portion C. The maximum width of the first grooves 11 of the region A where the cushion layer 100 is compressed is larger than the maximum width of the second grooves 12 of the region B where the cushion layer 100 is tensioned. Referring to FIG. 18, only the first grooves 11 may be disposed in the bending portion C. Also, referring to FIG. 19, only the second grooves 12 may be disposed in the bending portion C.

Figure 20:
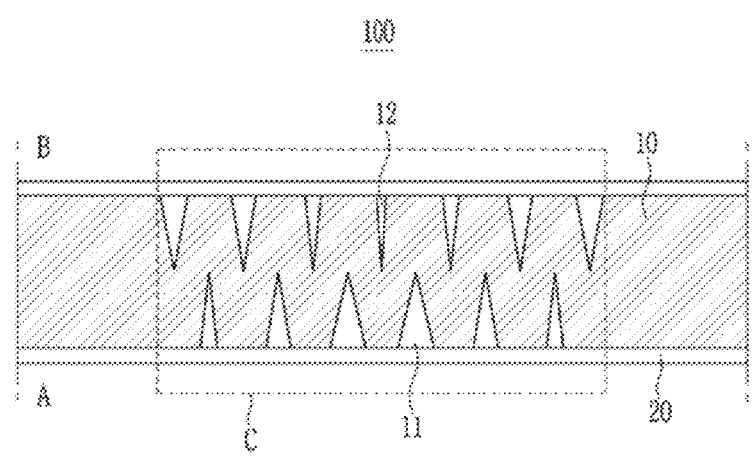
Figure 21:
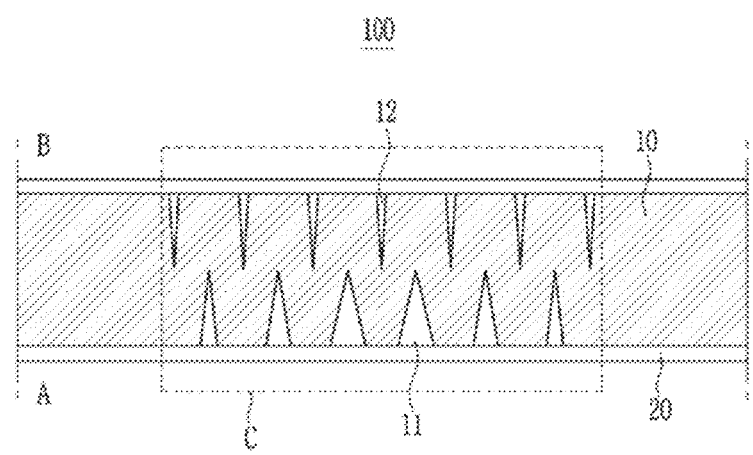
Figure 22:
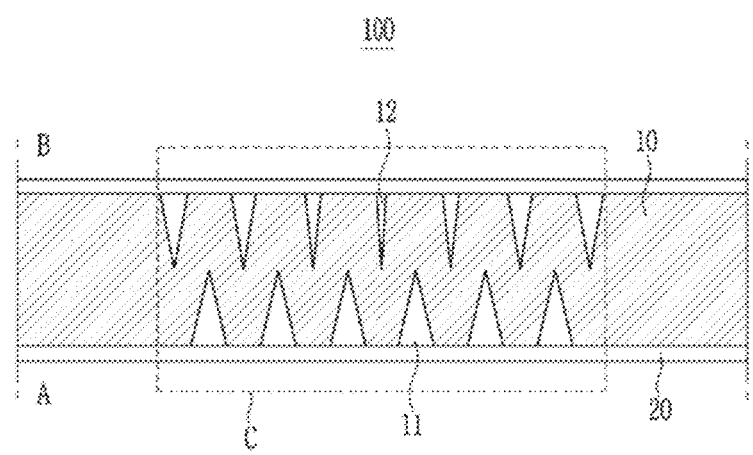

Referring to FIG. 20, the size of the first grooves 11 and the second grooves 12 of the bending portion C may be gradually changed. The size of the first grooves 11 may be increased closer to the center, and the size of the second grooves 12 may be decreased closer to the center. Also, referring to FIG. 21, only the size of the first grooves 11 may be increased closer to the center, and the size of the second grooves 12 may be uniform. Further, referring to FIG. 22, only the size of the second grooves 12 may be decreased closer to the center, and the size of the first grooves 11 may be uniform.

When the sizes of the grooves are differentiated in the region A where the compressive stress is applied and the region B where the tensile stress is applied and the size of the groove is gradually changed depending on the magnitude of the stress in the same region, the bending characteristic of the cushion layer 100 may be further increased.

Figure 23:
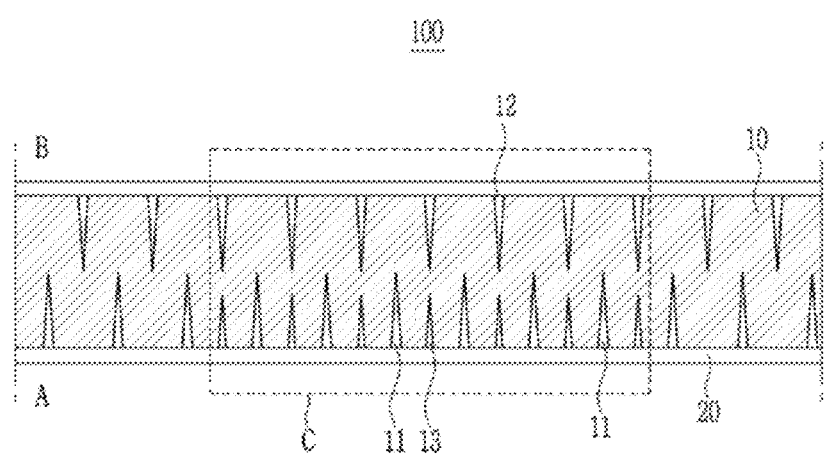

Next, the cushion layer 100, according to an exemplary embodiment of the present invention, is described. Referring to FIG. 23, the cushion layer 100, according to an exemplary embodiment of the present disclosure, includes a plurality of third grooves 13 disposed between the first grooves 11 in the bending portion C.

The third grooves 13 may have a shorter length than the first grooves 11. Accordingly, the third grooves 13 do not meet the second grooves 12. However, the third grooves 13 may have the same length as the first grooves 11. As an auxiliary layer such as the third grooves 13 is disposed at the region A where the compressive stress is applied, the compressive stress may be effectively offset. For example, the compressive stress is offset while empty spaces due to the groove are reduced, and as more grooves are disposed at the region A where the compressive stress is applied compared with the region B where the tensile stress is applied, more compressive stress may be offset.

Figure 24:
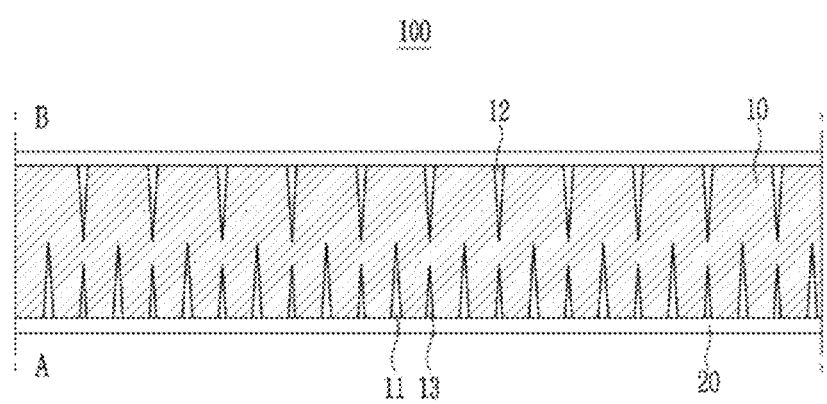

In FIG. 23, the third grooves 13 are only disposed in the bending portion C, however as shown in FIG. 24, the third grooves 13 may be disposed in the entire cushion layer 100. FIG. 23 is a structure that may be used when the bending portion C is specified, and the structure of FIG. 24 may effectively offset the compressive-tensile stress no matter what part is bent when the bending portion C is not specified in the cushion layer.

Figure 25:
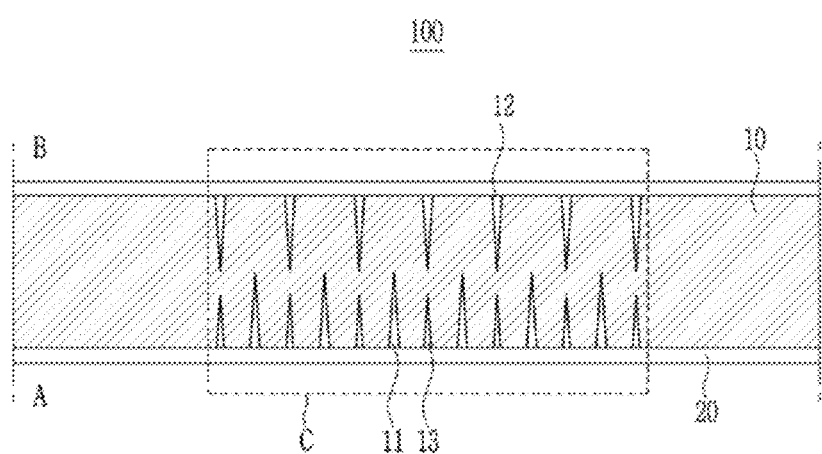

Also, as shown in FIG. 25, the first grooves 11, the second grooves 12, and the third grooves 13 may only be disposed in the bending portion, and the groove might not be disposed in the region that is not the bending portion C.

Figure 26:
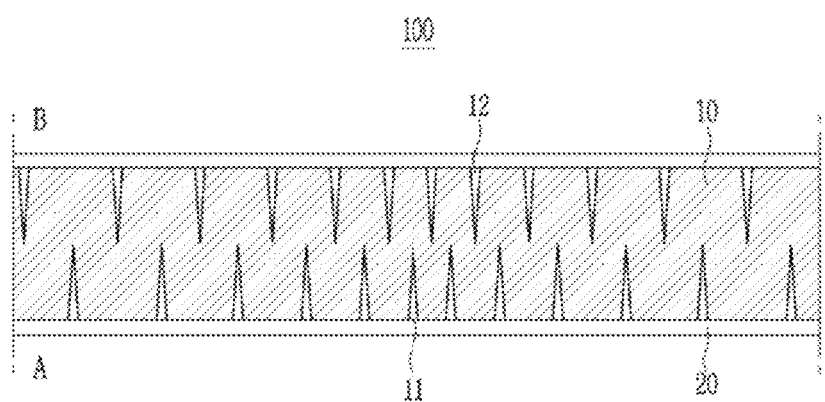

FIG. 26 is a diagram illustrating the cushion layer 100, according to an exemplary embodiment of the present invention. Referring to FIG. 26, in the cushion layer 100, according to an exemplary embodiment of the present disclosure, the cycle of the first grooves 11 and the cycle of the second grooves 12 may be shorter closer to the center from the edge of the cushion layer 100.

For example, the first grooves 11 and the second grooves 12 are densely formed at the center where most stress is concentrated during the bending, and are sparsely formed farther away from the center such that the compressive stress and the tensile stress may be effectively distributed.

Figure 27:
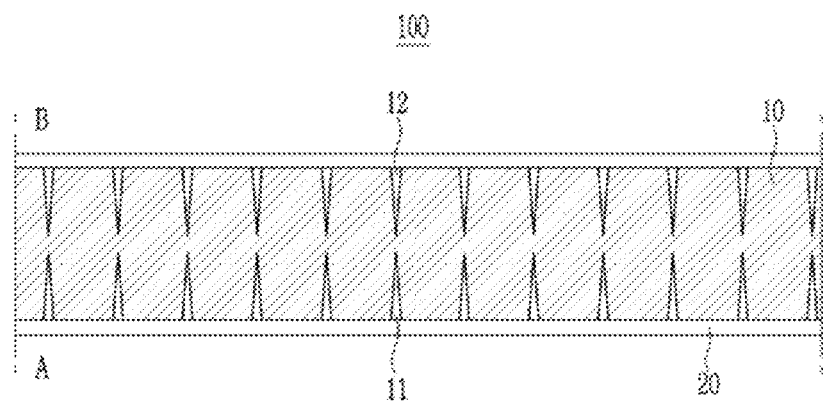

FIG. 27 is a diagram illustrating the cushion layer 100 according to an exemplary embodiment of the present invention. Referring to FIG. 27, the first grooves 11 and the second grooves 12 are disposed in parallel. For example, in FIG. 1 to FIG. 26, the first grooves 11 and the second grooves 12 are disposed to alternate with each other, however the first grooves 11 and the second grooves 12 are disposed in parallel on the same line in FIG. 27. In the above-described structure of FIG. 1 to FIG. 26, the structure in which the first grooves 11 and the second grooves 12 are changed to be in parallel like in FIG. 27 is included as an exemplary embodiment of the present invention.

Next, a manufacturing method of the cushion layer 100 according to an exemplary embodiment of the present invention is described.

Figure 28:
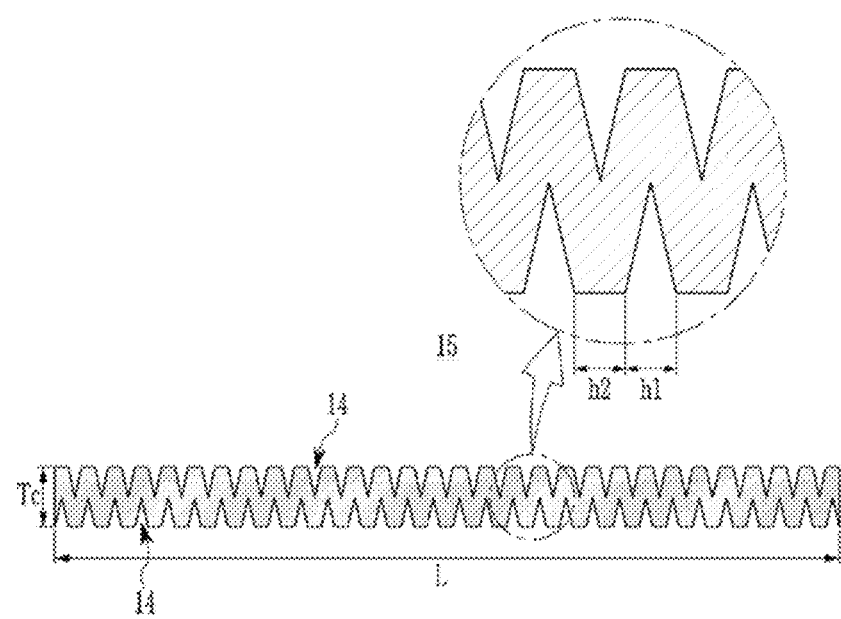
FIG. 28 to FIG. 30 are cross-sectional diagrams illustrating a manufacturing process of a cushion layer according to an exemplary embodiment of the present invention.
Figure 29:
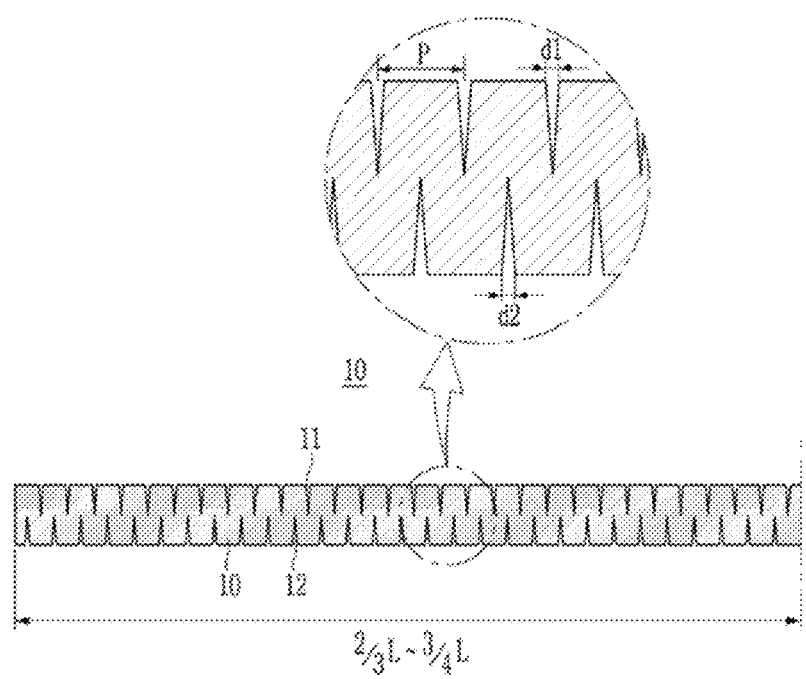
Figure 30:
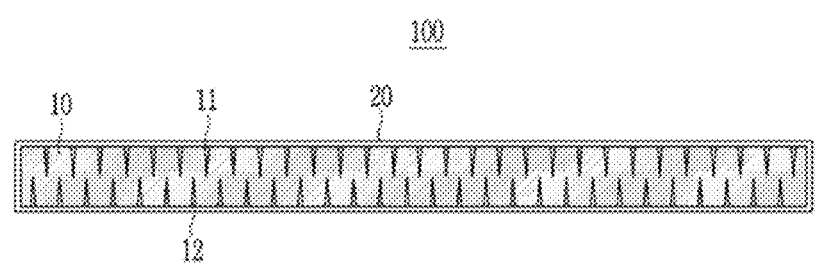

FIG. 28 to FIG. 30 are process cross-sectional views showing a manufacturing process of a cushion layer 100 according to an exemplary embodiment of the present invention.

Referring to FIG. 28, the cushion member 15 in the state that it is not compressed is first prepared.

The cushion member 15 has a plurality of grooves 14. In the cushion member 15, the ratio of the maximum width h1 of the grooves 14 and the minimum width h2 of the region where the groove is not formed may be 1:2 to 2:1. However, this is only an example, and other ratios may be used. For example, the ratio of the region where the groove is formed and the region where the groove is not formed may be 1:1.

The thickness Tc of the cushion member 15 may be within the range of 100 µm to 300 µm, inclusive. The cushion member 15 may include the material having the modulus within the range of 0.1 GPa to 1000 GPa, inclusive. The cushion member 15 may include polyethylene terephthalate (PET) and/or polyimide (PI), however other materials may be used.

In FIG. 28, the interval and the size of the plurality of grooves 14 of the cushion member are constant, however the grooves 14 of FIG. 28 may be one among the various structures described in FIG. 1 to FIG. 27.

Next, referring to FIG. 29, the cushion member 15 is compressed to form the first member 10. In FIG. 28, when the length of the cushion member 15 is referred to as L, the compressed thickness in FIG. 29 may be ⅔ L to ¾ L. For example, the first member 10 may be in a state in which the cushion member 15 is compressed by about 20% to 40%. By the compression, the first grooves 11 and the second grooves 12 having the smaller width than the grooves 14 of the cushion member 15 are formed.

In this case, the maximum width d1 of the first groove or the maximum width d2 of the second groove may be within the range of 10 µm to 400 µm, inclusive. When the maximum width d1 of the first groove or the maximum width d2 of the second groove is more than 400 µm, the cushion layer 100 might not absorb the impact of the display panel. This is because the empty space of the groove region does not absorb the impact when the impact is applied to the cushion layer 100 and the cushion layer 100 may be collapsed.

However, the width is only an example, and the maximum width d1 of the first grooves 11 and the maximum width d2 of the second grooves 12 may be different from each other. Also, in the region of the cushion layer 100, the width of the groove may be gradually increased or differentiated, and may be different for each region.

Also, the cycle P of the first grooves 11 or the second grooves 12 may be within the range of 20 µm to 1000 µm, inclusive. However, this is only an example, and other cycles may be used. As above-described, the formation cycle of the first grooves 11 and the second grooves 12 may be different from each other and may be differentiated in the bending region.

Next, referring to FIG. 30, the second member 20 enclosing the first member 10 is formed. The second member 20 may include the material having the lower modulus than the first member 10. For example, the modulus of the second member 20 may be within the range of 1 KPa to 1000 KPa, inclusive.

Since the second member 20 includes the material having the low modulus, the bending characteristic is excellent. Accordingly, even if the display device including the cushion layer 100 is bent, the display device may be easily bent without cracking.

As above-described, the cushion layer 100, according to an exemplary embodiment of the present invention, includes the first member 10 and the second member 20 having the different moduli, and the first member 10 includes the plurality of grooves. The impact resistance of the cushion layer 100 may be obtained by the first member 10 having the high modulus, and the excellent bending characteristic may be obtained through the absorption of the compress/tensile stress by the plurality of grooves included in the first member 10 and the second member 20 having the low modulus. Accordingly, when applying the cushion layer 100 to the curved display device, damage to the display panel may be prevented while still allowing for easy bending.

Exemplary embodiments described herein are illustrative, and many variations can be introduced without departing from the spirit of the disclosure or from the scope of the appended claims. For example, elements and/or features of different exemplary embodiments may be combined with each other and/or substituted for each other within the scope of this disclosure and appended claims.

What is claimed is:

1. A display device comprising:
a window;
a cushion layer; and
a display panel disposed on a top surface of the cushion layer, between the window and the cushion layer,
wherein the cushion layer includes a first member and a second member fully surrounding the first member in a cross-sectional view,
wherein the first member includes a first material having a first modulus,
wherein the second member includes a second material having a second modulus that is smaller than the first modulus, and
wherein the first member includes a plurality of grooves disposed therein.

2. The display device of claim 1, wherein the second member covers at least a top surface and a bottom surface of the first member and the plurality of grooves includes a plurality of first grooves included on the top surface of the first member and a plurality of second grooves included on the bottom surface of the first member, and
wherein top surfaces of each of the plurality of second grooves are at a same level as bottom surfaces of each of the plurality of first grooves.

3. The display device of claim 2, wherein maximum width of each of the plurality of first grooves is smaller than a maximum width of at least some of the plurality of second grooves.

4. The display device of claim 3,
wherein the cushion layer includes a bending portion, and
wherein a maximum width of each of the plurality of second grooves in the bending portion is larger than a maximum width of each of the plurality of second grooves not in the bending portion.

5. The display device of claim 3,
wherein the cushion layer includes a bending portion, and wherein the maximum width of each of the plurality of first grooves in the bending portion is smaller than a maximum width of each of the plurality of first grooves not in the bending portion.

6. The display device of claim 5, wherein the maximum width of each of the plurality of second grooves in the bending portion is larger than a maximum width of each of the plurality of second grooves not in the bending portion.

7. The display device of claim 1, wherein the first modulus is within a range of 0.1 GPa to 1000 GPa, inclusive.

8. The display device of claim 1, wherein the second modulus is within a range of 1 KPa to 1000 KPa, inclusive.

9. The display device of claim 1, wherein the first member includes polyethylene terephthalate and/or polyimide.

10. The display device of claim 1, wherein a cycle/interval at which the plurality of grooves are arranged is within a range of 20 μm to 1000 μm, inclusive.

11. The display device of claim 1, wherein a maximum width of each of the plurality of grooves is within a range of 10 μm to 400 μm, inclusive.

12. The display device of claim 1, wherein the second member locks the first member in a compressed state.

13. The display device of claim 2,
wherein the cushion layer includes a bending portion, and
wherein a maximum width of each of the plurality of second grooves in the bending portion is gradually increased closer to a center of the bending portion.

14. The display device of claim 2,
wherein the cushion layer includes a bending portion, and
wherein a maximum width of each of the plurality of first grooves in the bending portion is gradually decreased closer to a center of the bending portion.

15. The display device of claim 14, wherein the maximum width of each of the plurality of second grooves in the bending portion is gradually increased closer to the center of the bending portion.

16. The display device of claim 2, wherein a maximum width of each of the plurality of second grooves is gradually increased closer to a center of the cushion layer.

17. The display device of claim 2, wherein a maximum width of each of the plurality of first grooves is gradually decreased closer to a center of the cushion layer.

18. The display device of claim 17, wherein the maximum width of each of the plurality of second grooves is gradually increased closer to the center of the cushion layer.

19. The display device of claim 2, further including:
a plurality of third grooves interspersed with the plurality of first grooves, and
wherein an interval between each of the plurality of first grooves and an interval between each of the plurality of third grooves is less than an interval between each of the plurality of second grooves.

20. The display device of claim 2,
wherein the cushion layer includes a bending portion, and
wherein a plurality of third grooves interspersed with the plurality of first grooves in the bending portion.

21. The display device of claim 1, wherein a cycle/interval of the plurality of grooves is decreased closer to a center of the cushion layer.

22. The display device of claim 1,
wherein the plurality of grooves includes a plurality of first grooves disposed within a top surface of the first member and arranged so as to point towards a bottom surface of the first member and a plurality of second grooves disposed within the bottom surface of the first member and arranged so as to point towards the top surface of the first member, and
wherein the plurality of first grooves and the plurality of second grooves share centerlines.

23. The display device of claim 1, wherein the display device is bent and has a curved surface.

24. The display device of claim 1, wherein the display device is foldable.

25. A flexible display device comprising:
a window;
a cushion layer; and
a display panel disposed on a top surface of the cushion layer, between the window and the cushion layer,
wherein the cushion layer includes a first member and a second member at least partially surrounding the first member,
wherein the first member includes a first material having a first modulus,
wherein the second member includes a second material having a second modulus that is smaller than the first modulus,
wherein the cushion layer includes a bending portion,
wherein the first member includes a plurality of grooves disposed in the bending portion, and
wherein the first member locks the first member in a compressed state.

26. The flexible display device of claim 25, wherein the second member covers at least a top surface and a bottom surface of the first member and the plurality of grooves are included on both the top surface and the bottom surface of the bending portion.

27. The flexible display device of claim 25, wherein the plurality of grooves is located exclusively within the bending portion of the cushion layer.

28. The flexible display device of claim 25, wherein the plurality of grooves includes a plurality of first grooves disposed within the top surface of the first member and arranged so as to point towards the bottom surface of the first member and a plurality of second grooves disposed within the bottom surface of the first member and arranged so as to point towards the top surface of the first member.

29. The flexible display device of claim 28, wherein a maximum width of each of the plurality of second grooves is larger than a maximum width of each of the plurality of first grooves.

30. The flexible display device of claim 29, wherein the maximum width of each of the plurality of second grooves gradually increases closer to a center of the bending portion.

31. The flexible display device of claim 29, wherein the maximum width of each of the plurality of first grooves gradually increases closer to a center of the bending portion.

32. The flexible display device of claim 31, wherein the maximum width of each of the plurality of second grooves gradually increases closer to the center of the bending portion.

33. The flexible display device of claim 25, wherein the display device is bent in the bending portion.

34. A method of manufacturing a display device, comprising:
preparing a cushion member including a plurality of grooves disposed therein;
compressing the cushion member to form a first member in a compressed state; and
forming a second member surrounding the first member and locking the first member in the compressed state thereby,
wherein a modulus of the first member is larger than a modulus of the second member.

35. The method of claim 34, wherein the second member is disposed at least on a top surface and a bottom surface of the first member.

36. The manufacturing method of claim 34, wherein, in the compressing of the cushion member, the cushion member is compressed to have ⅔ to ¾ of an original length.

37. The manufacturing method of claim 34, wherein the modulus of the first member is within a range of 0.1 GPa to 1000 GPa, inclusive.

38. The manufacturing method of claim 34, wherein the cushion member includes polyethylene terephthalate and/or polyimide.

39. The manufacturing method of claim 34, wherein the modulus of the second member is within a range of 1 KPa to 1000 KPa, inclusive.

* * * * *